(12) United States Patent
Ohta et al.

(10) Patent No.: US 8,502,305 B2
(45) Date of Patent: Aug. 6, 2013

(54) SEMICONDUCTOR DEVICE AND METHOD FOR MANUFACTURING SAME

(75) Inventors: Tsuyoshi Ohta, Kanagawa-ken (JP); Tatsuya Nishiwaki, Kanagawa-ken (JP); Norio Yasuhara, Kanagawa-ken (JP); Masatoshi Arai, Tokyo (JP); Takahiro Kawano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/421,816

(22) Filed: Mar. 15, 2012

(65) Prior Publication Data
US 2013/0069147 A1 Mar. 21, 2013

(30) Foreign Application Priority Data
Sep. 21, 2011 (JP) ................................ 2011-206392

(51) Int. Cl.
*H01L 29/66* (2006.01)

(52) U.S. Cl.
USPC .................... 257/330; 257/367; 257/E21.419

(58) Field of Classification Search
USPC .......... 257/244, 274, 594, E21.042, E21.044, 257/E21.045, E21.056, E21.06, E21.369, 257/E21.4
See application file for complete search history.

(56) References Cited

U.S. PATENT DOCUMENTS

| 7,375,029 B2 | 5/2008 | Poelzl |
| 2006/0141739 A1 | 6/2006 | Poelzl |
| 2011/0169103 A1* | 7/2011 | Darwish et al. ............... 257/409 |

OTHER PUBLICATIONS

U.S. Appl. No. 13/239,101, filed Sep. 21, 2011, Ohta et al.

* cited by examiner

*Primary Examiner* — Cheung Lee
(74) *Attorney, Agent, or Firm* — Patterson & Sheridan, LLP

(57) ABSTRACT

According to an embodiment, a semiconductor device includes a semiconductor layer of a first conductive type, a base region of a second conductive type provided on the semiconductor layer and a first contact region of a second conductive type provided on the base region. The device includes a gate electrode provided in a trench piercing through the first contact region and the base region, and an interlayer insulating film provided on the gate electrode and containing a first conductive type impurity element. The device further includes a source region of a first conductive type provided between the interlayer insulating film and the first contact region, the source region being in contact with a side face of the interlayer insulating film and extending in the base region.

14 Claims, 22 Drawing Sheets

US 8,502,305 B2

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2011-206392, filed on Sep. 21, 2011; the entire contents of which are incorporated herein by reference.

FIELD

Embodiments are generally related to a semiconductor device and a method for manufacturing the same.

BACKGROUND

A power MOSFET (Metal Oxide Semiconductor Field Effect Transistor) is used for electric power conversion in consumer electric appliances and automobile motors or the like, and typically provided with electrodes both on an upper face and on a bottom face. Since this type of semiconductor device is used for power electric applications, it is required to sustain higher voltage, and to reduce power consumption. Thus, it is necessary to reduce resistance, when operating in the ON state (in the following, referred to as ON resistance).

A field plate structure is used as one of the ways for reducing the ON resistance. The field plate structure includes a gate electrode provided in a trench via a gate insulating film and a field plate electrode provided below the gate electrode via a field plate oxide film in the trench. Since the field plate electrode enhances carrier depletion in the drift layer, it is possible to reduce the specific resistance of a drift layer, while sustaining a high voltage. Hence, it is advantageous to reduce the ON resistance in this type of the MOSFET.

On the other hand, the distance between the trenches becomes narrower as miniaturizing the power MOSFET, resulting in the smaller width of a base region sandwiched therebetween. Accordingly, it is difficult to form a source region and a carrier extraction region in the base region, because alignment and patterning in the photolithography become too tight and fine.

BRIEF DESCRIPTION OF THE DRAWINGS

FIG. 1A is a schematic cross sectional view taken along a line X-Y in FIG. 1B; and FIG. 1B is a schematic plane view;

FIG. 9A is a schematic cross sectional view is illustrating a first variation; and FIG. 9B is a schematic cross sectional view illustrating a second variation;

DETAILED DESCRIPTION

Figure 1A:
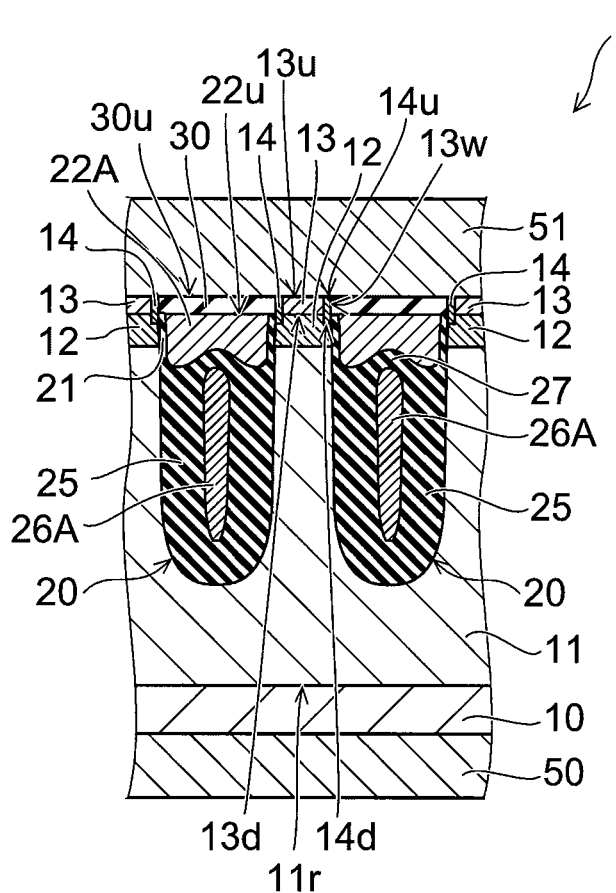
FIGS. 1A and 1B are schematic views illustrating a semiconductor device according to a first embodiment.

According to one embodiment, a semiconductor device includes a semiconductor layer of a first conductive type, a base region of a second conductive type provided on the semiconductor layer and a first contact region of a second conductive type provided on the base region. The device includes a gate electrode provided via a gate insulating film in a trench piercing through the first contact region and the base region and reaching the semiconductor layer and an interlayer insulating film provided on the gate electrode and containing a first conductive type impurity element. The device further includes a source region of a first conductive type provided between the interlayer insulating film and the first contact region, the source region being in contact with a side face of the interlayer insulating film and extending in the base region. The device also includes a first major electrode electrically connected to the semiconductor layer, and a second major electrode provided on the interlayer insulating film and connected to the source region and the first contact region.

Embodiments will now be described with reference to the drawings. In the following explanation, identical components are marked with the same reference numerals, and the description of the components once described is omitted appropriately.

First Embodiment

Figure 1B:
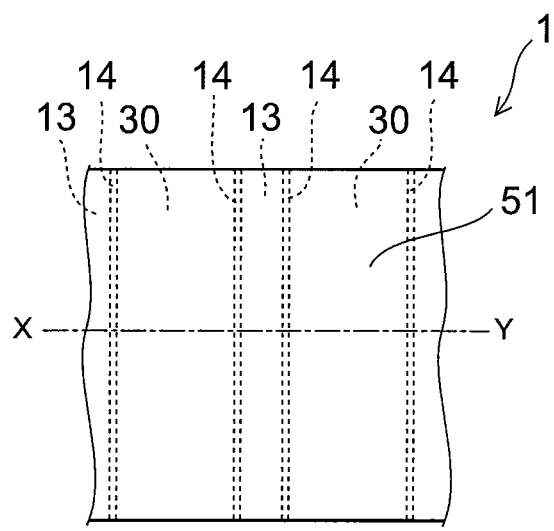

FIG. 1A and FIG. 1B are schematic views illustrating a semiconductor device according to a first embodiment. FIG. 1A is a schematic cross sectional view, and FIG. 1B is a schematic plane view. FIG. 1A shows the X-Y cross-section in FIG. 1B.

A semiconductor device 1 according to the first embodiment is a power MOSFET including electrodes provided on both upper and lower sides. The semiconductor device 1 includes a field plate structure. The semiconductor device 1 is an n-channel power MOSFET, for example.

In the semiconductor device 1, an n-type semiconductor layer 11 (a drift layer) is provided on an $n^+$-type semiconductor layer 10 (a drain layer). The concentration of an n-type impurity element in the n-type semiconductor layer 11 is lower than the concentration of an n-type impurity element in a semiconductor layer 10. A plurality of p-type base regions 12 are selectively provided on the surface of the semiconductor layer 11. A $p^+$-type contact region 13 (a first contact region) is provided on each of the plurality of base regions 12. For example, the contact region 13 is in contact with the base region 12 on the upper side of each of the plurality of base regions 12. The contact region 13 is a carrier extraction region. A source region 14 is in contact with a side face 13$w$ of the contact region 13. For example, the source region 14 faces the side face 13$w$ of the contact region 13. The thickness of is the source region 14 ranges from 0.2 μm (micrometer) to 0.5 μm, for example. The source region 14 penetrates into the base region 12 from a part of the surface of the base region 12. Namely, a lower end 14d of the source region 14 is located in the base region 12 deeper than a lower end 13d of the contact region 13. The concentration of a p-type impurity contained in the contact region 13 is lower than the concentration of an n-type impurity contained in the source region 14.

In the semiconductor device 1, a plurality of trenches 20 pierce the base region 12 from an upper end 14u of the source region 14. The bottom of the trench 20 reaches the semiconductor layer 11. A gate electrode 22A is provided in the trench 20 via a gate insulating film 21. In the trench 20, a field plate electrode 26A is provided below the gate electrode 22A via a field plate insulating film 25. An insulating film 27 is provided between the gate electrode 22A and the field plate electrode 26A. In the trench 20, an interlayer insulating film 30 containing an n-type impurity element is provided on the gate electrode 22A and the gate insulating film 21. An upper face 22u of the gate electrode 22A is located lower than an upper face 13u of the contact region 13. An upper face 30u of the interlayer insulating film 30, the upper end 14u of the source region 14, and the upper face 13u of the contact region 13 are flush with each other. Namely, there is no step between the upper face 30u of the interlayer insulating film 30 and the upper end 14u of the source region 14, and between the upper end 14u of the source region 14 and the upper face 13u of the contact region 13.

In the semiconductor device 1, a drain electrode (a first major electrode) 50 is in contact with the semiconductor layer 10. The drain electrode 50 is electrically connected to the semiconductor layer 11. A source electrode (a second major electrode) 51 is provided on the interlayer insulating film 30. The source electrode 51 may be connected to ground potential, and the source electrode 51 may be electrically connected to the field plate electrode 26A.

The source electrode 51 is connected to the source region 14 and the contact region 13. The interlayer insulating film 30 is provided between the gate electrode 22A and the source electrode 51. The interlayer insulating film 30 is in contact with the gate electrode 22A and the source region 14. A distance between the upper end 14u of the source region 14 and a back surface 11r of the semiconductor layer 11 is longer than a distance between the upper face 22u of the gate electrode 22A and the back surface 11r of the semiconductor layer 11. A distance between the lower end 14d of the source region 14 and the back surface 11r of the semiconductor layer 11 is shorter than the distance between the upper face 22u of the gate electrode 22A and the back surface 11r of the semiconductor layer 11. The distance between the lower end 14d of the source region 14 and the back surface 11r of the semiconductor layer 11 is shorter than a distance between the lower surface 13d of the contact region 13 and the back surface 11r of the semiconductor layer 11. A barrier metal layer such as TiW may be provided between the source electrode 51 and the interlayer insulating film 30 and between the source electrode 51 and the semiconductor member.

The semiconductor layer 10, the semiconductor layer 11, the base region 12, the contact region 13, and the source region 14 are made of silicon (Si), for example. The gate insulating film 21 and the field plate insulating film 25 are silicon oxide ($SiO_2$), for example. The materials of the gate electrode 22A and the field plate electrode 26A are polysilicon. The poly-silicon may contain an n-type or a p-type impurity element. The material of the interlayer insulating film 30 is silicon oxide ($SiO_2$) containing an n-type or a p-type impurity element, silicon oxynitride (SiON) containing an n-type or a p-type impurity element, silicon nitride ($Si_3N_4$) containing an n-type or a p-type impurity element, or the like. That is, the interlayer insulating film 30 contains the impurity that converts the conductivity in the contact region 13. The material of the drain electrode 50 is a metal such as copper (Cu) or aluminum (Al). The material of the source electrode 51 is a metal such as molybdenum (Mo), aluminum (Al), or copper (Cu).

An n-type and an $n^+$-type may be the first conductive type, and a p-type and a $p^+$-type may be the second conductive type. The first conductive type impurity elements are phosphorus (P), arsenic (As), or the like. The second conductive type impurity element is boron B, for example.

The method for manufacturing the semiconductor device 1 will be described.

FIG. 2A to FIG. 8B are schematic cross sectional views illustrating the manufacturing process of the semiconductor device according to the first embodiment.

Figure 2A:
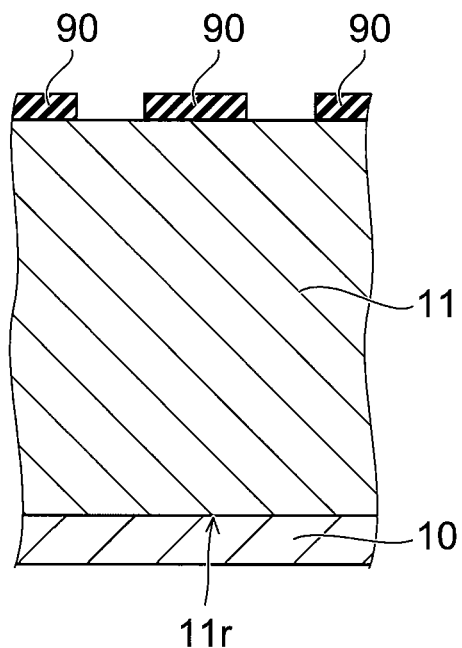
FIGS. 2A to 8B are schematic cross sectional views illustrating a manufacturing process of the semiconductor device according to the first embodiment.

First, as shown in FIG. 2A, the semiconductor layer 11 formed on the semiconductor layer 10 is prepared on a semiconductor substrate. A patterned resist layer 90 is formed on the surface of the semiconductor layer 11.

Figure 2B:
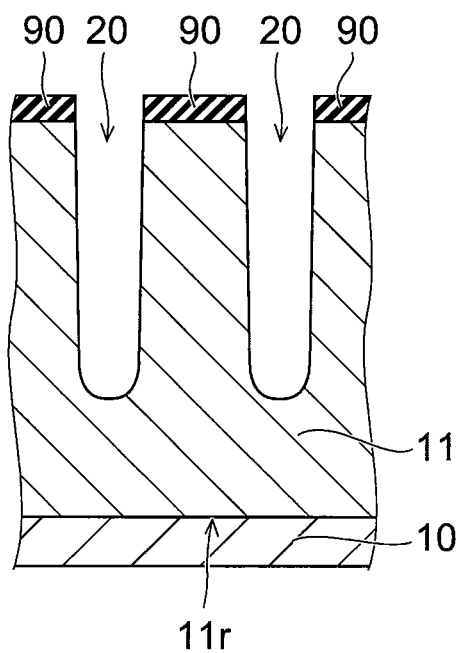

Subsequently, as shown in FIG. 2B, the trench 20 is selectively formed in the semiconductor layer 11 from the surface not covered with the resist layer 90. The trench 20 is formed by dry etching, for example.

Figure 3A:
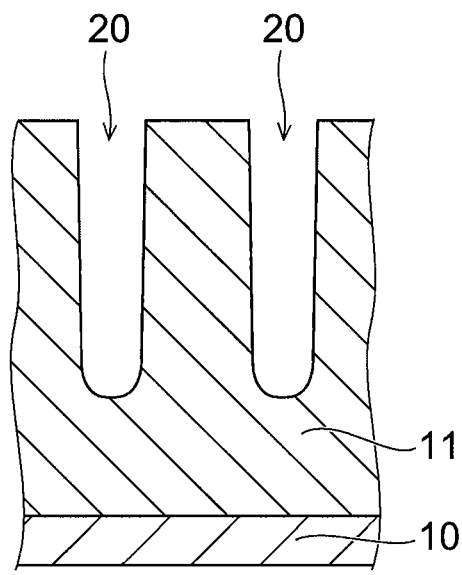

Subsequently, as shown in FIG. 3A, the resist layer 90 is removed.

Figure 3B:
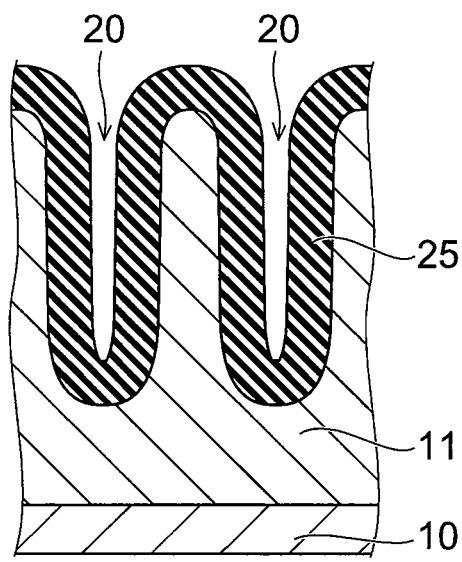

Subsequently, as shown in FIG. 3B, the field plate insulating film 25 is formed on the inner side face of the trench 20. The field plate insulating film 25 is formed by oxidizing the exposed surface of the semiconductor layer 11 in the trench 20. The surface of the semiconductor layer 11 is oxidized by LOCOS (Local Oxidation of Silicon) in an oxidizing atmosphere, for example. Thus, the field plate insulating film 23 is formed on the exposed surface of the semiconductor layer 11.

Figure 4A:
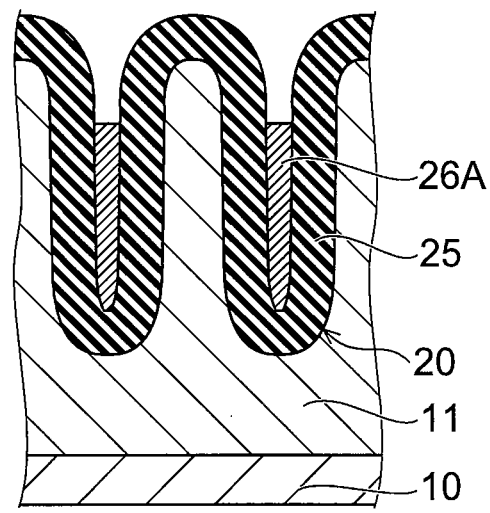

Subsequently, as shown in FIG. 4A, the field plate electrode 26A is formed in the trench 20 via the field plate insulating film 25. The field plate electrode 26A is formed by CVD (Chemical Vapor Deposition).

Figure 4B:
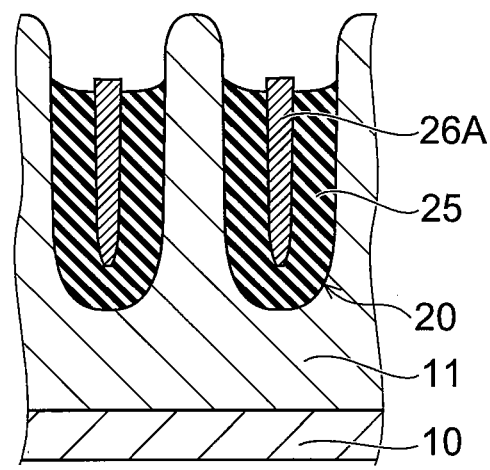

Subsequently, as shown in FIG. 4B, the field plate insulating film 25 is selectively etched until the upper end of the field plate electrode 26A is lower than the upper end of the field plate insulating film 25. Here, wet etching is used in this process.

Figure 5A:
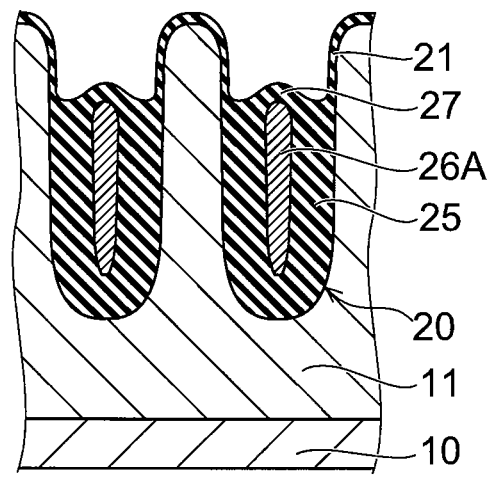

Subsequently, as shown in FIG. 5A, the gate insulating film 21 is formed on the inner side face of the trench 20. The insulating film 27 is further formed on the field plate electrode 26A. The gate insulating film 21 and the insulating film 27 are formed simultaneously by thermal oxidation in an oxidizing atmosphere, for example.

Figure 5B:
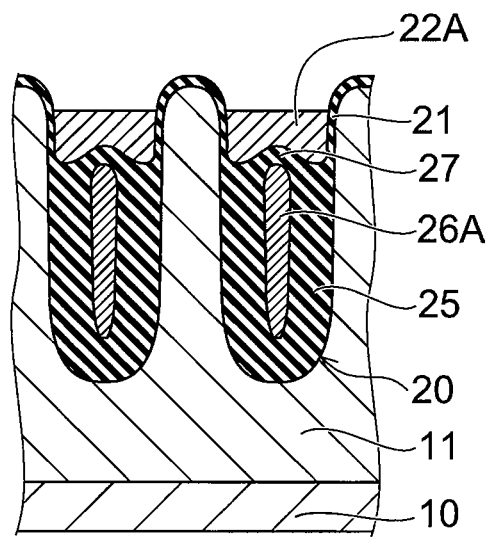

Subsequently, as shown in FIG. 5B, in the trench 20, the gate electrode 22A is formed on the field plate electrode 26A via the gate insulating film 21. In this formation, the gate electrode 22A is formed in such a way that the upper face 22u of the gate electrode 22A is lower than the surface of the semiconductor layer 11. The height of the upper face 22u of the gate electrode 22A may be adjusted by deposition time or etch back time of the poly-silicon film.

Figure 6A:
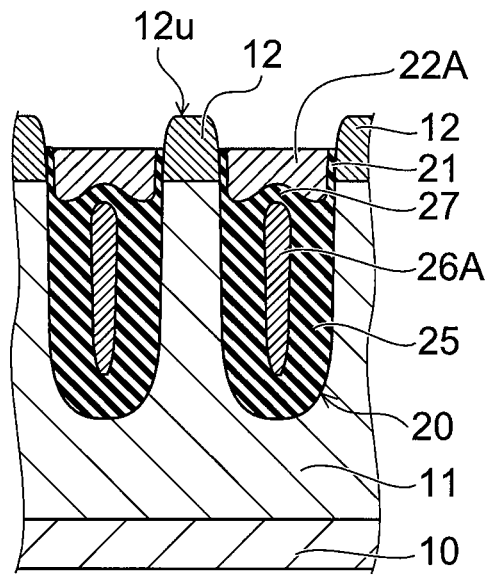

Subsequently, as shown in FIG. 6A, a p-type impurity element is introduced into the semiconductor layer 11, and the portion located higher than the lower end of the gate electrode 22A is converted into the p-type base region 12. A p-type impurity element is introduced into the semiconductor layer 11 by ion implantation, for example.

Figure 6B:
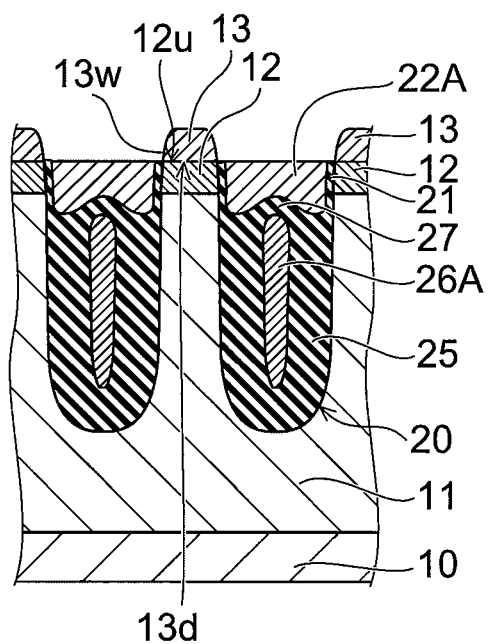

Subsequently, as shown in FIG. 6B, a p-type impurity element is further introduced into the base region 12, and the portion located higher than the upper face 22u of the gate electrode 22A is converted into the p⁺-type contact region 13. In this stage, the contact region 13 at a concentration lower than the concentration of the source region 14 is formed on the entire region of the upper portion of the finely patterned pillar semiconductor layer 11.

Figure 7A:
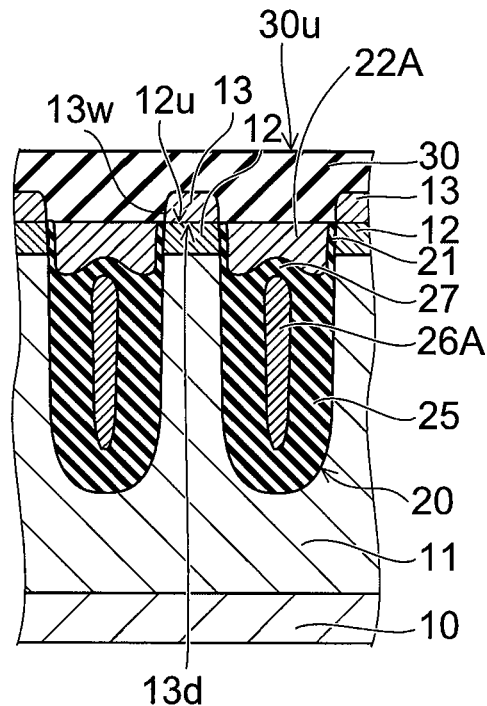

Subsequently, as shown in FIG. 7A, the upper face 22$u$ of the gate electrode 22A and the upper face 13$u$ and side face 13$w$ of the contact region 13 are covered with the interlayer insulating film 30 containing an n-type impurity element. The interlayer insulating film 30 is a PSG (Phosphor Silicate Glass) film containing phosphorus (P), for example. The impurity concentration of phosphorus (P) in the interlayer insulating film 30 may be uniform, or may not be uniform, depending on the heat treatment and the impurity concentration in the contact region 13. For example, in order to enhance the thermal diffusion of phosphorus (P) into the contact region 13, as described later, the interlayer insulating film 30 may contain the n-type impurity element at the higher concentration as being closer to the contact region 13.

Figure 7B:
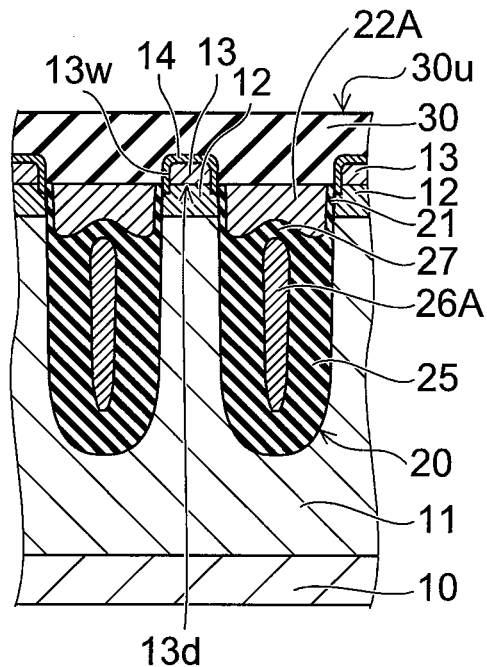

Subsequently, as shown in FIG. 7B, the n-type impurity element contained in the interlayer insulating film 30 is introduced into the upper face 13$u$ and side face 13$w$ of the contact region 13 and a part of the surface 12$u$ of the base region 12. For example, when the interlayer insulating film 30 is subjected to heat treatment, the n-type impurity element contained in the interlayer insulating film 30 is introduced into the upper face 13$u$ and side face 13$w$ of the contact region 13 by thermal diffusion. The n-type impurity element is also introduced into a part of the surface 12$u$ of the base region 12. Rapid thermal annealing (RTA) is used for the heat treatment. Thus, the upper face 13$u$ and side face 13$w$ of the contact region 13 and a part of the surface 12$u$ of the base region 12 are converted into the n⁺-type source region 14.

Namely, in the contact region 13, a portion is converted to the n-type region, where phosphorus (P) is diffused from the interlayer insulating film 30, and the thin source region 14 is formed therein. At the same time, the finely patterned contact region 13 is formed in the center of the upper portion of the semiconductor layer 11.

Figure 8A:
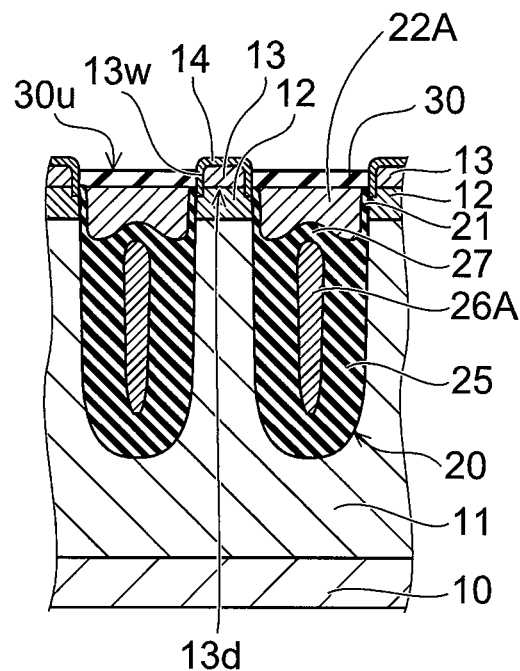

Subsequently, as shown in FIG. 8A, the interlayer insulating film 30 is etch-backed by wet etching, for example, and the source region 14 formed on the upper face 13$u$ of the contact region 13 is exposed from the upper face 30$u$ of the interlayer insulating film 30.

Figure 8B:
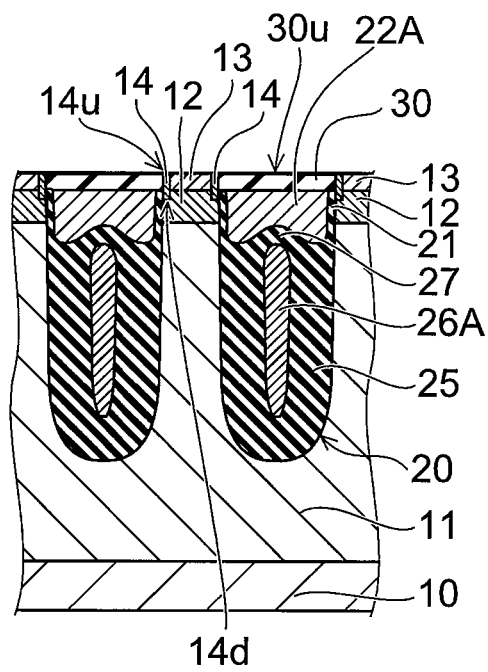

Subsequently, as shown in FIG. 8B, the source region 14 formed on the upper face 13$u$ of the contact region 13 is removed in such a way that the source region 14 remains on the side face 13$w$ of the contact region 13 and a part of the surface 12$u$ of the base region 12. The source region 14 formed on the upper face 13$u$ of the contact region 13 is removed using dry etching, wet etching, CMP (Chemical Mechanical Polishing), or the like, for example.

By removing the source region 14 formed on the upper face 13$u$ of the contact region 13, the source region 14 continuously formed on the upper face 13$u$ and the side face 13$w$ of the contact region 13 and a part of the surface 12$u$ of the base region 12 is separated into the two portions. In this step, the upper face 30$u$ of the interlayer insulating film 30, the upper end 14$u$ of the source region 14, and the upper face 13$u$ of the contact region 13 are formed to be flush with each other.

Then, the drain electrode 50 and the source electrode 51 are formed as shown in FIG. 1. The drain electrode 50 is electrically connected to the semiconductor layer 11, and the source electrode 51 is electrically connected to the source region 14 and the contact region 13 and provided on the interlayer insulating film 30. Thus, the manufacturing process of the semiconductor device 1 is completed.

According to the first embodiment, rapid thermal annealing is applied to the interlayer insulating film 30 to diffuse the n-type impurity element into the contact region 13 above the drift layer. This rapid thermal annealing keeps the impurity diffusion in a very shallow portion. Consequently, the thin source region 14 is formed. Since the material of the interlayer insulating film 30 is an insulator, the diffusion coefficient of the interlayer insulating film 30 for an impurity element is small. Therefore, the thermal diffusion of an impurity element in the interlayer insulating film 30 is suppressed so that an excess amount of an impurity element is not introduced into the contact region 13. Thus, the thin source region 14 is formed, containing an impurity element at a high concentration. The impurity concentration of the source region 14 is in the range from $3 \times 10^{19}$ (atoms/cm³) to $3 \times 10^{20}$ (atoms/cm³), for example. Consequently, the specific resistance of the source region 14 is low, and the semiconductor device 1 is formed having low ON resistance.

For example, if the source region 14 at a high concentration is formed by ion implantation, it is likely that the source region 14 is formed to be an amorphous region due to excess ion implantation. In the first embodiment, the source region 14 is not made amorphous, and the thin source region 14 is formed with the high impurity concentration.

According to the first embodiment, the interlayer insulating film 30 also insulates the gate electrode 22A from the source electrode 51 in addition to supply an impurity element for forming the source region 14. Thus, it is possible to reduce manufacturing cost.

According to the first embodiment, the source region 14 can be formed without using the photolithography. Namely, the diffusion of an n-type impurity element from the interlayer insulating film 30 forms the source region 14 in a self-alignment manner. Thus, when the miniaturization advances between the trenches 20, it is possible to form the source region 14 with high accuracy.

According to the first embodiment, the contact region 13 is formed in the entire upper portion of the semiconductor layer 11 sandwiched between the trenches 20 before forming the source region 14. Therefore, the contact region 13 is also formed without the photolithography. The impurity concentration in the contact region 13 is set lower than the impurity concentration in the source region 14, so that the source region 14 is formed by rapid thermal annealing in a self-alignment manner. Accordingly, both the source region 14 and the contact region 13 can be miniaturized with high accuracy.

Such a device is known that the contact region 13 is deeply inserted into the base region 12. However, in this type of device, the contact region 13 may deeply enter the base region 12, when the thickness of the contact region 13 is varied in the manufacturing process. The contact region 13 with a high impurity concentration is sometimes located close to the MOS channel, thereby increasing the threshold voltage (Vth) beyond the targeted value. On the contrary, according to the first embodiment, the contact region 13 is formed shallower than the source region 14. Therefore, the contact region 13 will not be located close to the MOS channel, and the threshold voltage (Vth) will not be increased.

According to the first embodiment, the upper face 30$u$ of the interlayer insulating film 30, the upper end 14$u$ of the source region 14, and the upper face 13$u$ of the contact region 13 are formed to be flush with each other. Therefore, the barrier metal layer is provided on the flat surface thereof without a step. When the barrier metal layer is formed on the step, the layer thickness on the step portion becomes thin, and sometimes causes a metal migration from the source electrode 51 into the source electrode 51 or the contact region 13. According to the first embodiment, since the barrier metal layer is formed on the flat surface without the step, it is possible to suppress the metal migration. Moreover, since a step does not be generated in the upper face 30u of the interlayer insulating film 30, the upper end 14u of the source region 14, and the upper face 13u of the contact region 13, it is possible to make the barrier metal layer thin, reducing the material cost and the production time thereof. Since the upper face 30u of the interlayer insulating film 30, the upper end 14u of the source region 14, and the upper face 13u of the contact region 13 formed to be flush with each other, the upper end 14u of the source region 14 surely contacts with the source electrode 51. Consequently, the good contact between the source region 14 and the source electrode 51 is obtained.

According to the first embodiment, a p-channel power MOSFET may be formed using p-type semiconductor layers 10 and 11, an n-type base region 12, and a BSG (Boron Silicate Glass) film containing boron B, for example.

Figure 9A:
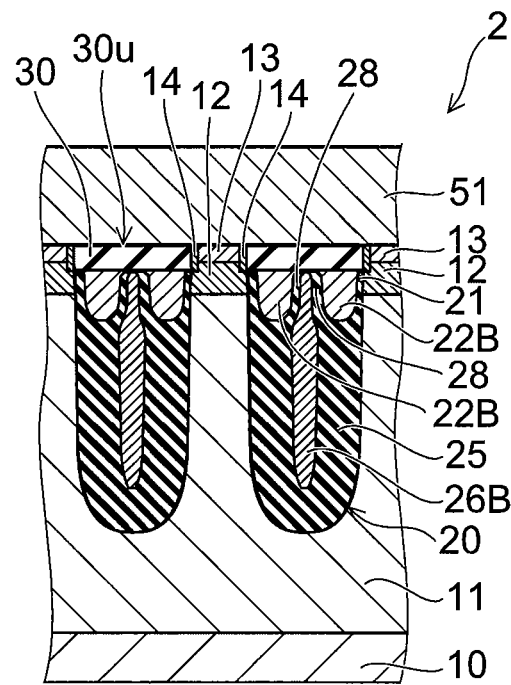
FIGS. 9A and 9B are schematic cross sectional views illustrating a semiconductor device according to variations of the first embodiment.
Figure 9B:
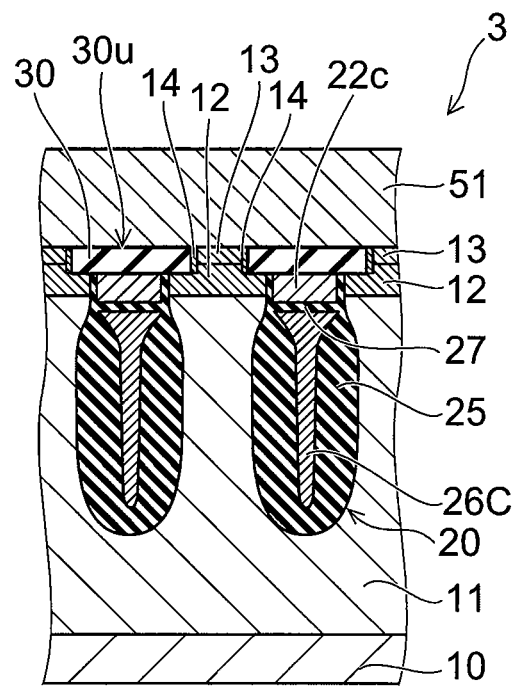

FIG. 9A and FIG. 9B are schematic cross sectional views illustrating semiconductor devices according to variations of the first embodiment. FIG. 9A is a schematic cross sectional view illustrating a first variation, and FIG. 9B is a schematic cross sectional view illustrating a second variation.

The basic structure of a semiconductor device 2 shown in FIG. 9A is the same as the semiconductor device 1. The upper end of a field plate electrode 26B is sandwiched between gate electrodes 22B in the semiconductor device 2. An insulating film 28 is provided between the upper end of the field plate electrode 26B and the gate electrode 22B.

A source region 14 and a contact region 13 in the semiconductor device 2 are formed by the similar manufacturing process as the manufacturing process of the source region 14 and the contact region 13 in the semiconductor device 1. Therefore, the source region 14 and the contact region 13 are also miniaturized with high accuracy in the semiconductor device 2.

The basic structure of a semiconductor device 3 shown in FIG. 9B is the same as the semiconductor device 1. A field plate electrode 26C faces a gate electrode 22C via flat surfaces thereof. A width of a base region 12 sandwiched between trenches 20 adjacent to each other is wider than a minimum width of a semiconductor layer 11 sandwiched between the trenches 20. A width of a contact region 13 sandwiched between the trenches 20 in the semiconductor device 3 is wider than the width of the contact region 13 sandwiched between the trenches 20 in the semiconductor device 1.

Therefore, in the semiconductor device 3, more carriers flow into the source electrode 51 through the contact region 13 than in the semiconductor device 1. Consequently, the avalanche breakdown voltage of the semiconductor device 3 becomes higher than the avalanche breakdown voltage of the semiconductor device 1.

The semiconductor device 1 may be manufactured through the different process.

Figure 10A:
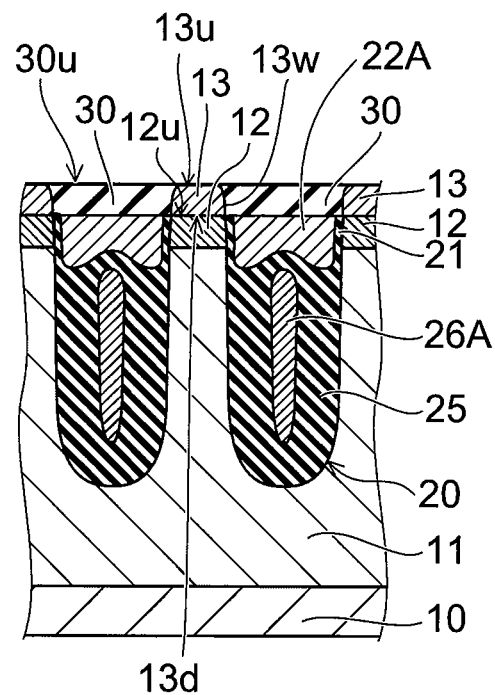
FIGS. 10A and 10B are schematic cross sectional views illustrating a variation of the manufacturing process of the semiconductor device according to the first embodiment.
Figure 10B:
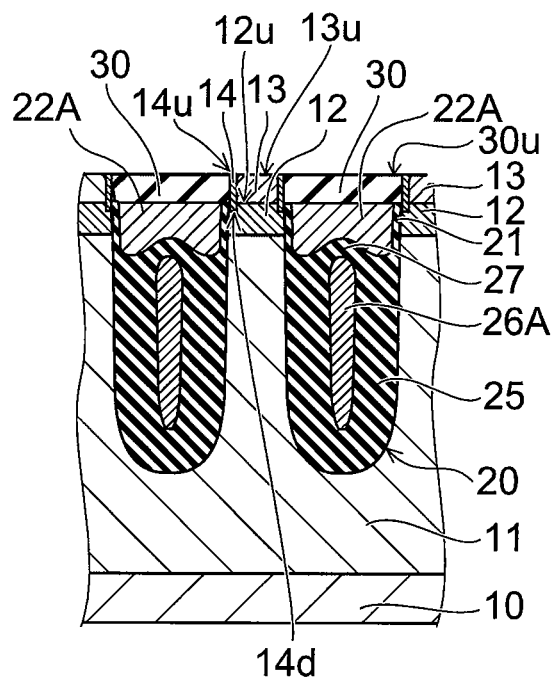

FIG. 10A and FIG. 10B are schematic cross sectional views illustrating a variation of the manufacturing process of the semiconductor device according to the first embodiment.

For example, the manufacturing steps shown in FIGS. 2A to 7A are the same in the variation, and as shown in FIG. 10, the interlayer insulating film 30 is etch-backed after the step shown in FIG. 7A.

In FIG. 10A, the upper face 22u of the gate electrode 22A and the side face 13w of the contact region 13 are covered with the interlayer insulating layer 30 containing an n-type impurity element. The upper face 30u of the interlayer insulating layer 30 formed to be flush with the upper face 13u of the contact region 13. The upper face 13u of the contact region 13 is exposed.

Subsequently, as shown in FIG. 10B, rapid thermal annealing is applied to the interlayer insulating layer 30, and the n-type impurity element contained in the interlayer insulating layer 30 is introduced into the side face 13w of the contact region 13 and a part of the surface 12u of the base region 12. Thus, the side face 13w of the contact region 13 and a part of the surface 12u of the base region 12 are converted into the n-type source region 14.

Then, the drain electrode 50 and the source electrode 51 are formed as shown in FIG. 1. The drain electrode 50 is electrically connected to the semiconductor layer 11. The source electrode 51 is connected to the source region 14 and the contact region 13 and covers the interlayer insulating film 30.

In the manufacturing process shown in FIG. 10A and FIG. 10B, the step for etching the upper face 13u of the contact region 13 as illustrated in FIG. 8A and FIG. 8B is eliminated.

Second Embodiment

Figure 11:
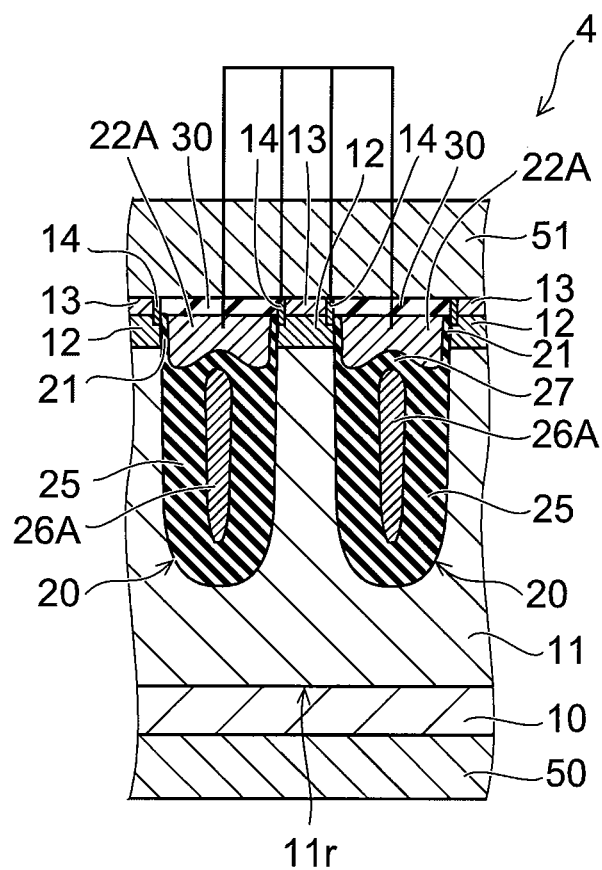
FIG. 11 is a schematic cross sectional view illustrating a semiconductor device according to a second embodiment.

FIG. 11 is a schematic cross sectional view illustrating a semiconductor device according to a second embodiment.

The basic structure of a semiconductor device 4 according to the second embodiment 4 is the same as the semiconductor device 1. In the semiconductor device 4, a gate electrode 22A is electrically connected to a source electrode 51. Furthermore, the threshold voltage (Vth) is set to about 0.1 V, for example, by reducing a p-type impurity concentration in a base region 12.

In the semiconductor device 4, the gate electrode 22A serves as an anode electrode, and a drain electrode 50 serves as a cathode electrode. Namely, the semiconductor device 4 can be regarded as a two-terminal device and operates as the diode with a self-biased gate.

In the semiconductor device 4, when a positive potential is applied to the anode electrodes (the gate electrode 22A) and a negative potential is applied to the cathode electrode (the drain electrode 50), i.e. applying a forward bias, a forward current flows from the anode electrode to the cathode electrode.

On the contrary, when a negative potential is applied to the anode electrode and a positive potential is applied to the cathode electrode, i.e. applying a reverse bias, only a leak current that is very small as compared with the forward current flows from the cathode electrode to the anode electrode. Thus, the semiconductor device 4 exhibits an excellent rectifying action. At the reverse bias, owing to a negative potential applied to the gate electrode 22A, positive electric charges are gathered near the gate insulating film 21 in the base region 12. Therefore, a depletion layer extending from the pn junction interface to the base region 12 side does not reach a source region 14. Thus, a so-called punch through does not occur in the semiconductor device 4. Since the semiconductor device 4 includes the field plate electrode 26A, the concentration of an impurity contained in the semiconductor layer 11 can be set higher. Thus, the specific resistance of the semiconductor layer 11 becomes lower, and a forward voltage drop (VF) that makes a current flow in the forward direction of the diode becomes lower.

In the semiconductor device 4, the impurity concentration in the base region 12 may be set much lower, whereby the forward voltage drop (VF) is further reduced. When a positive potential is applied to the anode electrode, a forward current is more increased.

Third Embodiment

FIG. 12A to FIG. 16B are schematic cross sectional views illustrating the manufacturing process of a semiconductor device according to a third embodiment.

In the third embodiment, after forming a field plate electrode 26A, a p-type impurity element is introduced into an upper portion 11u of a semiconductor layer 11. The upper portion 11u of the semiconductor layer 11 is defined as a portion above the field plate electrode 26A, for example.

Figure 12A:
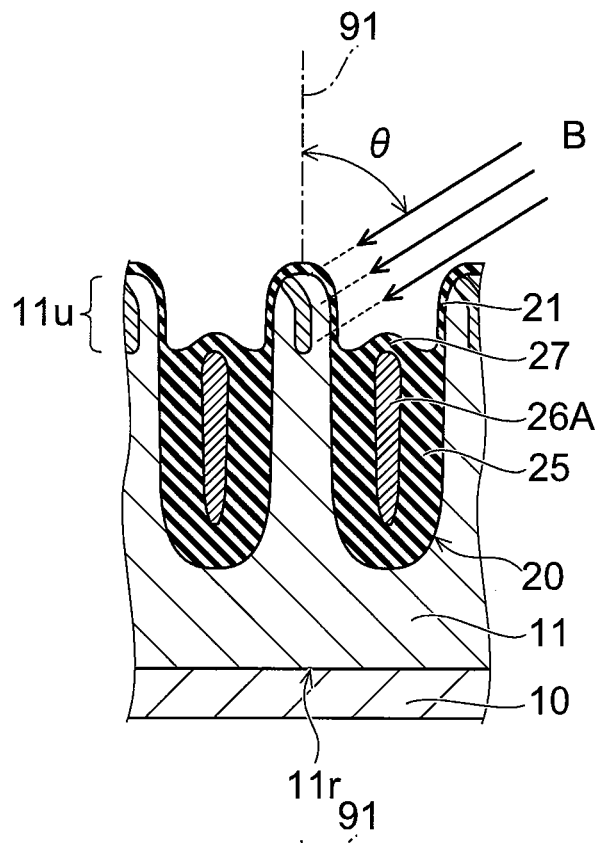
FIGS. 12A to 16B are schematic cross sectional views illustrating a manufacturing process of a semiconductor device according to a third embodiment.

First, the step shown in FIG. 5A is carried out. Subsequently, as shown in FIG. 12A, a p-type impurity element such as boron B, for example, is implanted to the upper portion 11u of the semiconductor layer 11 not in parallel with a back surface normal 91. A tilt angle θ formed between the back surface normal 91 and the incident direction of boron is set in a range from 0 to 70°, for example. More specifically, the tilt angle θ is 60°.

Figure 12B:
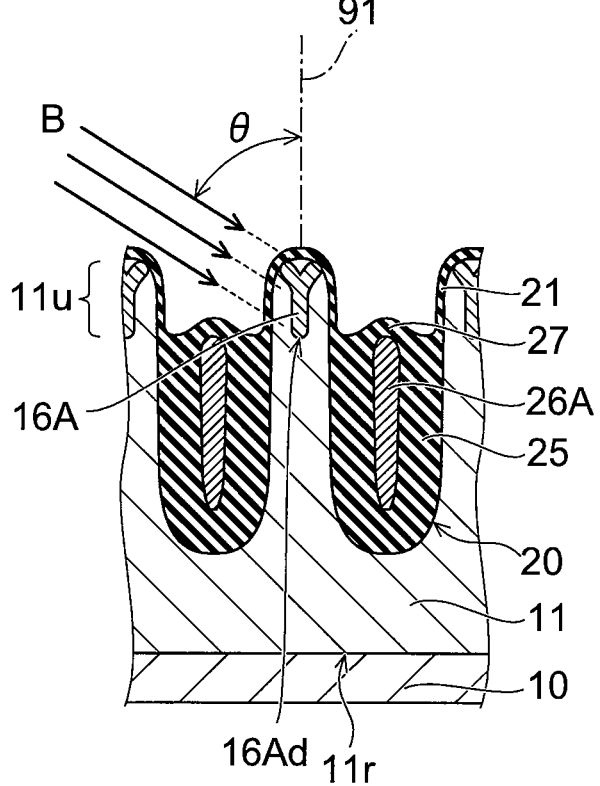

In the step shown in FIG. 12A, for example, boron is implanted from the right to the left in the drawing in the upper portion 11u of the semiconductor layer 11 sandwiched between the trenches 20 adjacent to each other. In the boron implantation, the implant energy, dosed amount, incident angle, and the like are adjusted. As shown in FIG. 12B, boron is implanted from the left to the right in the drawing in the upper portion 11u of the semiconductor layer 11 sandwiched between the trenches 20. The incident angle θ in this case is adjusted in the range from 0 to 70°. More specifically, the tilt angle θ is adjusted to be 60°. The other conditions are the same as in the step shown in FIG. 12A.

Thus, a p-type contact region 16A is formed in the upper portion 11u of the semiconductor layer 11, extending in a direction from the upper portion 11u to a semiconductor layer 10. In the third embodiment, the tilt angle θ is adjusted so that a lower end 16Ad of the contact region 16A is lower than the lower end of a base region 12, described later.

Figure 13A:
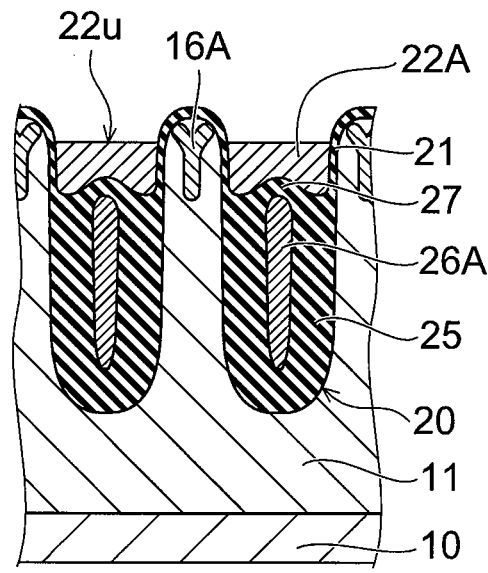

Subsequently, as shown in FIG. 13A, in the trench 20, a gate electrode 22A is formed on the field plate electrode 26A via a gate insulating film 21. The gate electrode 22A is formed in such a way that an upper face 22u of the gate electrode 22A is lower than the upper surface of the semiconductor layer 11. The height of the upper face 22u is adjusted by the deposition thickness or etch-back time of the poly-silicon layer.

Figure 13B:
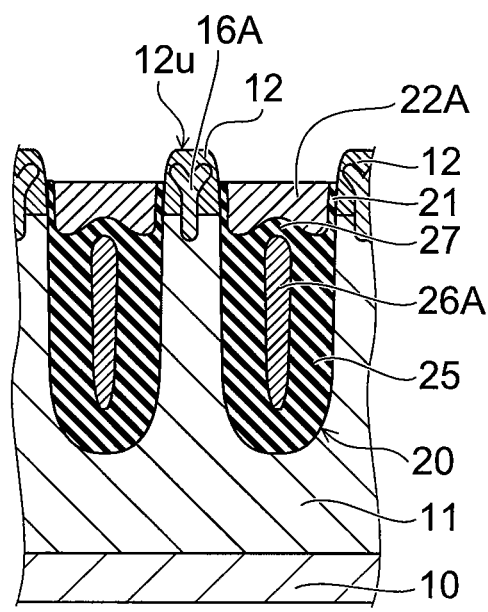

Subsequently, as shown in FIG. 13B, a p-type impurity element is introduced into the semiconductor layer 11 located higher than the lower end of the gate electrode 22A. Thus, the portion located higher than the lower end of the gate electrode 22A is converted into the p-type base region 12. A p-type impurity element is introduced into the semiconductor layer 11 by ion implantation, for example. Here, the concentration of a p-type impurity contained in the base region 12 is set to be lower than the concentration of a p-type impurity contained in the contact region 16A.

Figure 14A:
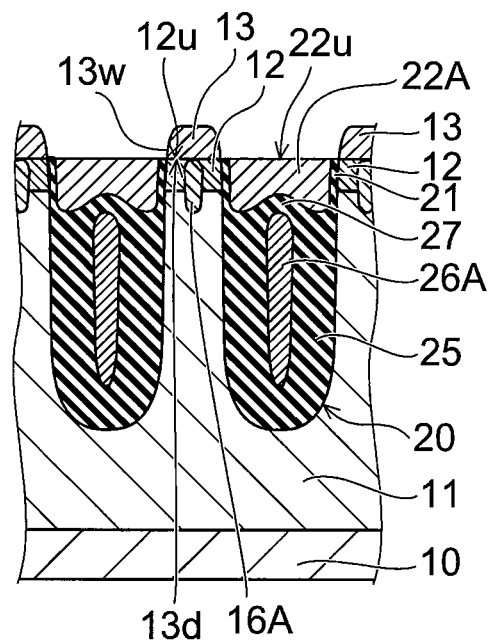

Subsequently, as shown in FIG. 14A, a p-type impurity element is further introduced into the base region 12 located higher than the upper face 22u of the gate electrode 22A, whereby the portion located higher than the upper face 22u of the gate electrode 22A is converted into a p$^+$-type contact region 13. In this step, the contact region 13 having a lower impurity concentration than a source region 14 is formed on the entire upper portion of the semiconductor layer 11 which is finely patterned into a pillar shape. The concentration of a p-type impurity contained in the contact region 13 is set to be higher than the concentration of a p-type impurity contained in the contact region 16A.

Figure 14B:
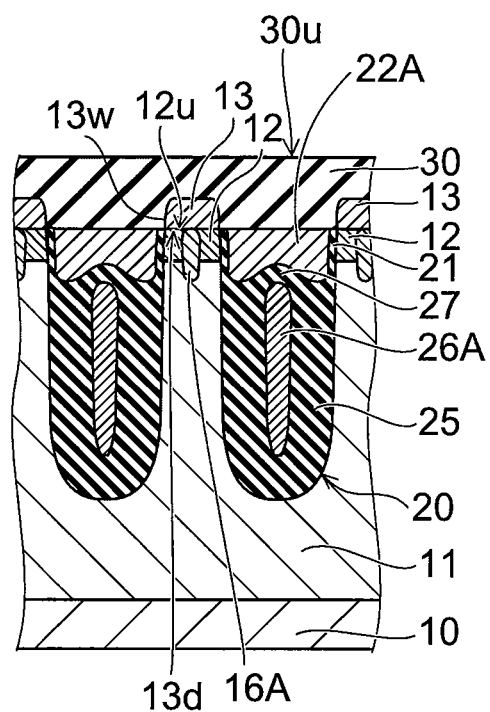

Subsequently, as shown in FIG. 14B, the upper face 22u of the gate electrode 22A and an upper face 13u and side face 13w of the contact region 13 are covered with an interlayer insulating film containing an n-type impurity element. The interlayer insulating film 30 is a PSG (Phosphor Silicate Glass) film containing phosphorus (P), for example. The impurity concentration of is phosphorus (P) in the interlayer insulating film 30 may be uniform, or may not be uniform, depending on the annealing condition and the impurity concentration in the contact region 13. For example, in order to enhance the thermal diffusion of phosphorus (P) into the contact region 13, the interlayer insulating film 30 may preferably contain the n-type impurity element at higher concentration as being closer to the contact region 13.

Figure 15A:
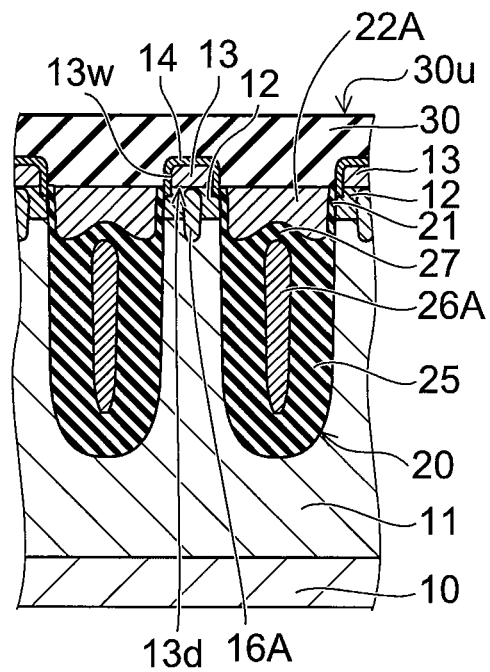

Subsequently, as shown in FIG. 15A, the n-type impurity element contained in the interlayer insulating film 30 is introduced into the upper face 13u and side face 13w of the contact region 13 and a part of a surface 12u of the base region 12. For example, when the interlayer insulating film 30 is subjected to heat treatment, the n-type impurity element contained in the interlayer insulating film 30 is introduced into the upper face 13u and side face 13w of the contact region 13 by thermal diffusion. The n-type impurity element is also introduced into a part of the surface 12u of the base region 12. The rapid thermal annealing (RTA) is preferably used for the heat treatment. Thus, the upper face 13u and side face 13w of the contact region 13 and a part of the surface 12u of the base region 12 are converted into the n$^+$-type source region 14.

Namely, the portion in the contact region 13, where phosphorus (P) is diffused from the interlayer insulating film 30, is converted to the n$^+$-type region, resulting in the thin source region 14. At the same time, the finely patterned contact region 13 is formed in the center of the upper portion of the semiconductor layer 11.

Figure 15B:
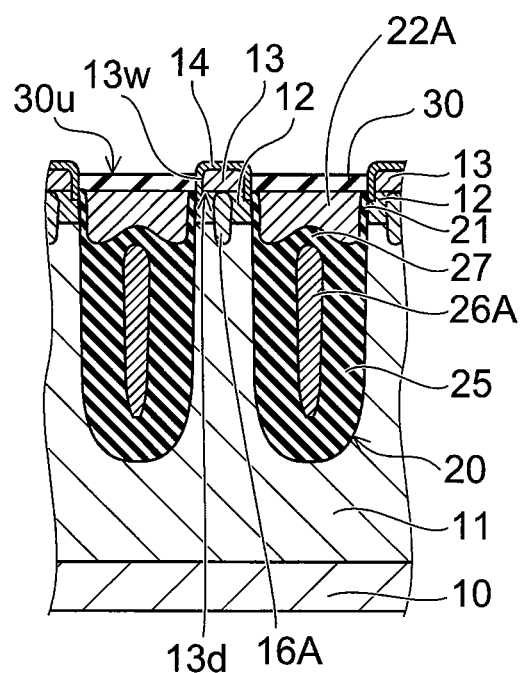

Subsequently, as shown in FIG. 15B, the interlayer insulating film 30 is etch-backed by wet etching, for example, and the source region 14 formed on the upper face 13u of the contact region 13 is exposed from an upper face 30u of the interlayer insulating film 30.

Figure 16A:
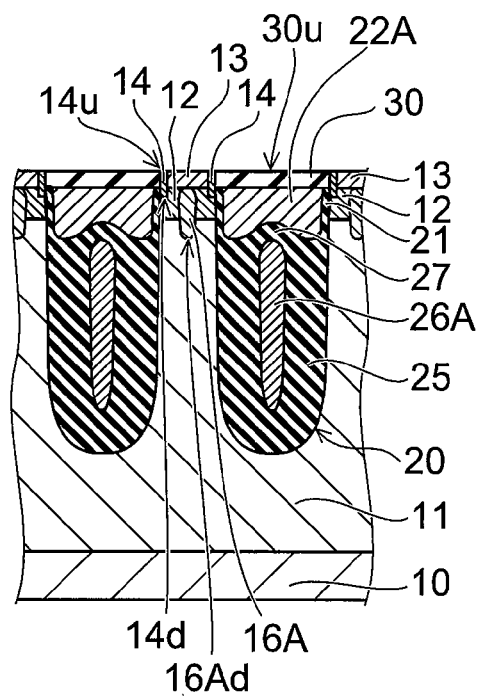

Subsequently, as shown in FIG. 16A, the source region 14 formed on the upper face 13u of the contact region 13 is removed in such a way that the source region 14 remains on the side face 13w of the contact region 13 and a part of the surface 12u of the base region 12. The source region 14 formed on the upper face 13u of the contact region 13 is removed by dry etching, wet etching, CMP (Chemical Mechanical Polishing), or the like, for example.

By removing the source region 14 on the upper face 13u of the contact region 13, separating the source region 14 continuously formed on the contact region 13 and a part of the surface 12u of the base region 12 is separated into two portions. In this step, the upper face 30u of the interlayer insulating film 30, the upper end 14u of the source region 14, and the upper face 13u of the contact region 13 are formed to be flush with each other.

Figure 16B:
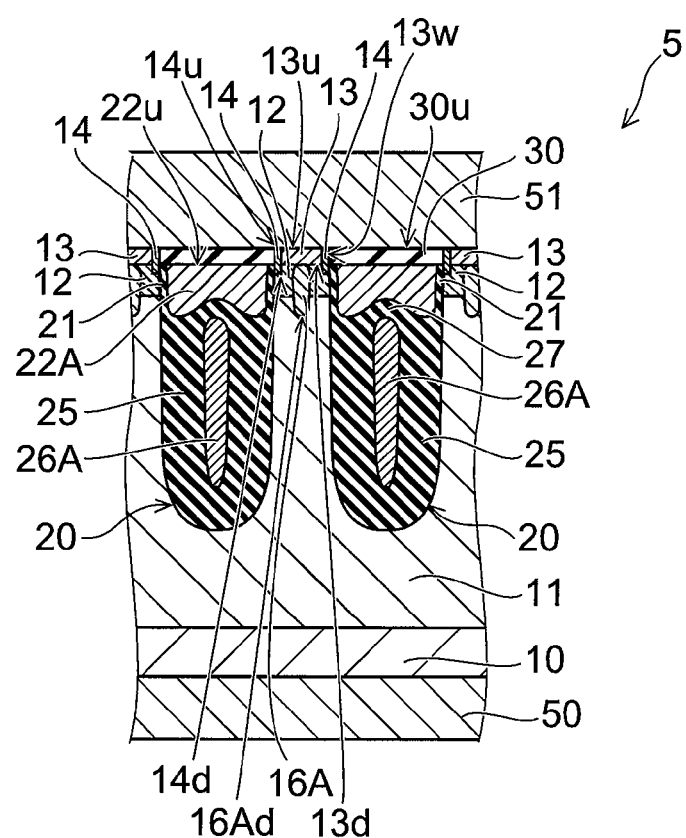

Then, a drain electrode 50 and a source electrode 51 are formed as shown in FIG. 16B. The drain electrode 50 is electrically connected to the semiconductor layer 11. The source electrode 51 is connected to the source region 14 and the contact region 13 and covers the interlayer insulating film 30. Thus, the manufacturing process of the semiconductor device 5 according to the third embodiment is completed.

The semiconductor device 5 includes the configuration of the semiconductor device 1, and further includes the p-type contact region 16A connected to the contact region 13. The contact region 16A extends from the contact region 13 to the semiconductor layer 11 side. A distance between the lower end 16Ad of the contact region 16A and the back surface 11r of the semiconductor layer 11 is shorter than a distance between the lower end 14d of the source region 14 and the back surface 11r of the semiconductor layer 11. Namely, the lower end 16Ad of the contact region 16A is located lower than the lower end 14d of the source region 14. The concentration of a p-type impurity contained in the contact region 16A is lower than the concentration of a p-type impurity contained in the contact region 13, and higher than or almost the same as the concentration of a p-type impurity contained in the base region 12.

In the semiconductor device 5, the distance between the lower end 16Ad of the contact region 16A and the back surface 11r of the semiconductor layer 11 is shorter than a distance between the lower end of the base region 12 and the back surface 11r. Namely, in the semiconductor device 5, the contact region 16A projects into the semiconductor layer 11.

According to the third embodiment, since the contact region 16A serving as a carrier extraction region is further provided in addition to the contact region 13, whereby holes are easily discharged through the contact region 16A, and the avalanche breakdown voltage in the semiconductor device 5 is further increased as compared with the semiconductor device 1.

It is noted that in the third embodiment, the steps of forming the contact region 16A is not limited to the aforementioned order.

FIG. 17A to FIG. 18B are schematic cross sectional views illustrating the manufacturing process of a semiconductor device according to the third embodiment.

Figure 17A:
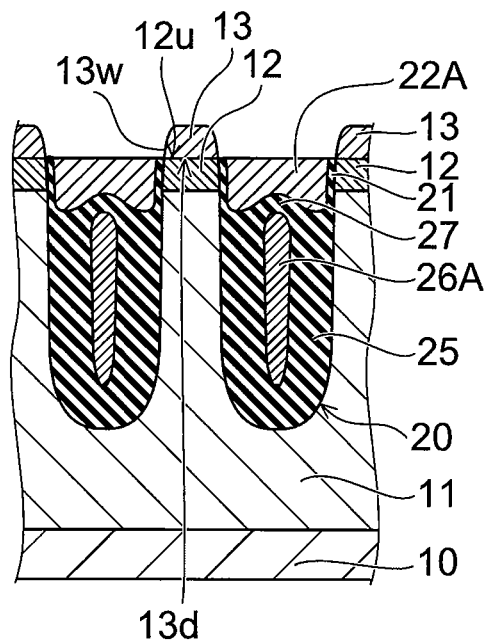
FIGS. 17A to 18B are schematic cross sectional views illustrating a manufacturing process of another semiconductor device according to the third embodiment.

First, the step shown in FIG. 17A is carried out beforehand. Namely, a base region 12 and a contact region 13 are formed on a semiconductor layer 11.

Figure 17B:
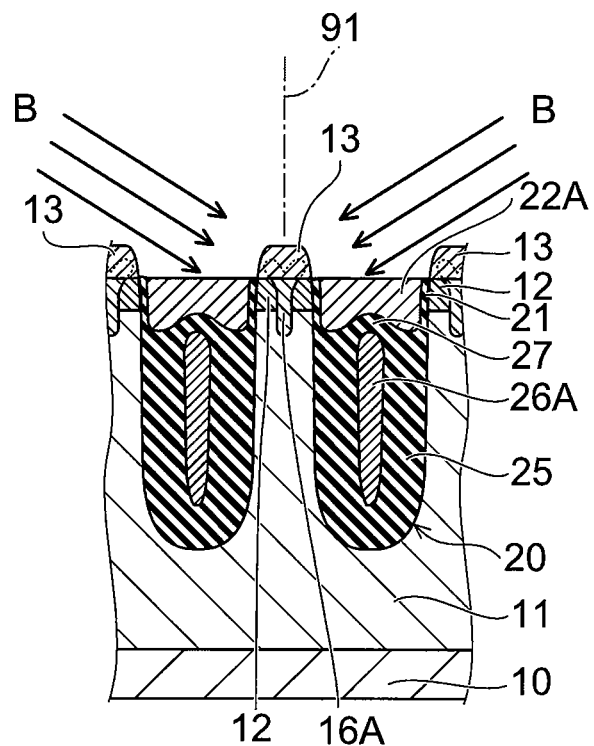

Then, the oblique ion implantation described above is performed on an upper portion 11u of the semiconductor layer 11 as shown in FIG. 17B. Thus, a contact region 16A extending from the surface of the upper portion 11u of the semiconductor layer 11 to a semiconductor layer 10 is formed in the upper portion 11u of the semiconductor layer 11. It is noted that since the impurity concentration of the contact region 16A is lower than the impurity concentration of the contact region 13, the contact region 16A formed in the contact region 13 is indicated by a dotted line in FIG. 17B.

Subsequently, the semiconductor device 5 is formed through the steps after FIG. 14B. The contact region 16A may be formed in such order.

Figure 18A:
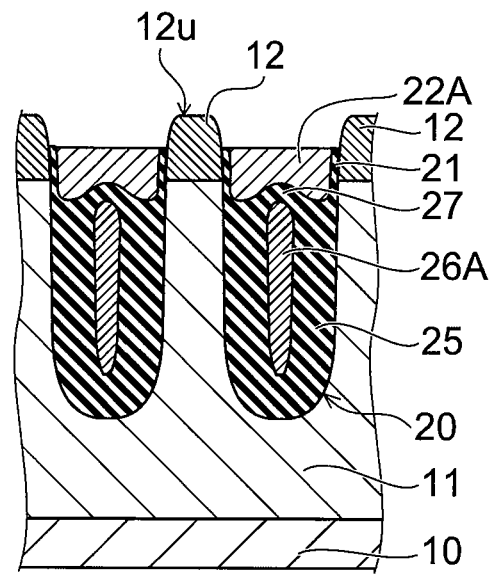

As shown in FIG. 18A, the step shown in FIG. 6A is carried out beforehand. Namely, the base region 12 is formed on the semiconductor layer 11.

Figure 18B:
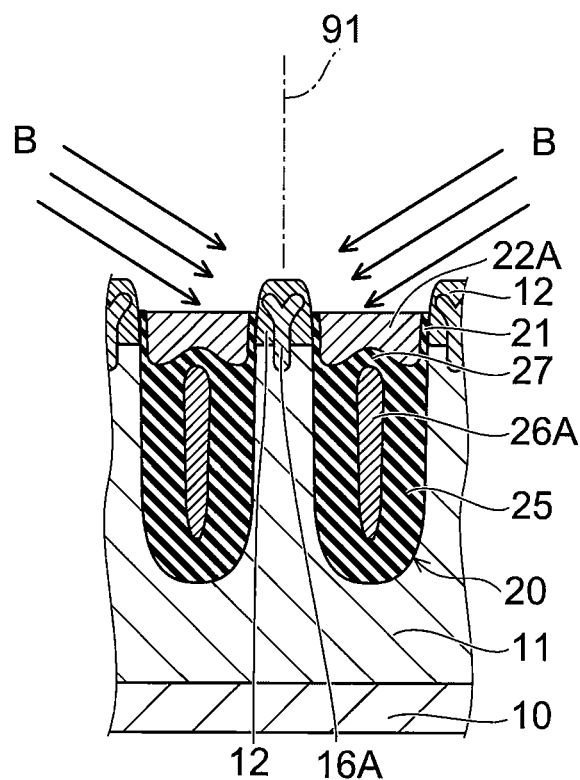

Then, the oblique ion implantation described above is performed on the upper portion 11u of the semiconductor layer 11 as shown in FIG. 18B. Thus, the contact region 16A extending from the surface of the upper portion 11u of the semiconductor layer 11 to the semiconductor layer 10 is formed in the upper portion 11u of the semiconductor layer 11. Subsequently, the semiconductor device 5 is formed through the steps after FIG. 14A. The contact region 16A may be formed in such order.

According to the manufacturing process shown in FIG. 17A to FIG. 18B, even though heat treatment (for example, 900° C. to 950° C.) is applied for activating the base region 12, the contact region 16A is formed after this heat treatment, so that an impurity element in the contact region 16A will not be thermally defused by activating the base region 12.

There is a method for forming the contact region 16A using photolithography. However, manufacturing steps are increased by adding the photolithography steps, and the position of the contact region 16A may shift from the target position, when using the photolithography. Since the semiconductor layer 11 sandwiched between the trenches 20 is a narrow pillar, the contact region 16A may overlap with the channel of the base region 12. In the manufacturing process using the photolithography, in order to form the lower end 16Ad of the contact region 16A at the deep position as shown in FIG. 13, the ion implantation is carried out for three to four times with the vertical incidence condition ($\theta=0°$). Since acceleration energy is intentionally increased for deeply forming the lower end 16Ad of the contact region 16A in the vertical ion implantation, the implanted ions are sometimes laterally scattered. Consequently, the threshold voltage (Vth) of the MOS channel shifted from the predetermined value.

On the contrary, in the third embodiment, the contact region 16A is formed in a self-alignment manner without photolithography. Therefore, the position of the contact region 16A does not shift. When forming the contact region 16A, two times oblique ion implantations are carried out from the right and the left sides as shown in FIG. 12A and FIG. 12B. Since the width through which the impurity elements pass through silicon is about a half width of the pillar shaped semiconductor layer 11, the influence of scattering is small.

Fourth Embodiment

Figure 19A:
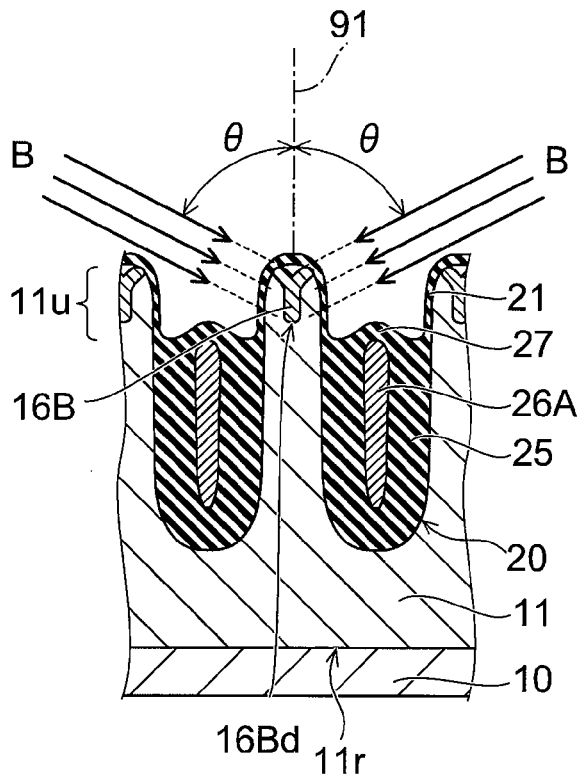
FIGS. 19A and 19B are schematic cross sectional views illustration a manufacturing process of a semiconductor device according to a fourth embodiment.
Figure 19B:
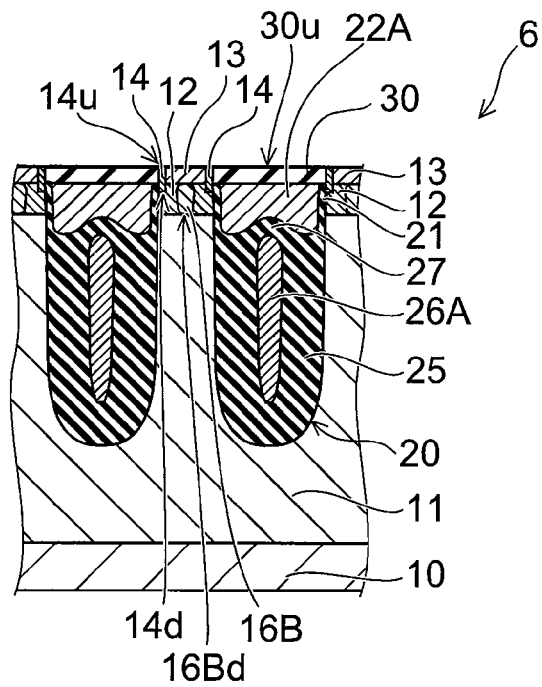

FIG. 19A and FIG. 19B are schematic cross sectional views illustrating the manufacturing process of a semiconductor device according to a fourth embodiment.

In the fourth embodiment, after forming a field plate electrode 26A, a p-type impurity element is introduced into an upper portion 11u of a semiconductor layer 11.

First, the step shown in FIG. 5A described above is carried out. Subsequently, a p-type impurity element such as boron B, for example, is implanted to the upper portion 11u of the semiconductor layer 11 not in parallel with a back surface normal 91 as shown in FIG. 19A. A tilt angle $\theta$ formed between the back surface normal 91 and the incident direction of boron is set in the range from 0 to 70°, for example. More specifically, the tilt angle $\theta$ is 65°.

For example, boron is implanted from the right to the left and from the left to the right in the drawing in the upper portion 11u of the semiconductor layer 11 sandwiched between the adjacent trenches 20. In the boron implantation, the implant energy, dosed amount, incident angle, and the like are adjusted. The tilt angle $\theta$ in this case is set smaller than that in the third embodiment.

Thus, a p-type contact region 16B is formed in the upper portion 11u of the semiconductor layer 11, extending in the direction from the upper portion 11u to a semiconductor layer 10. In the fourth embodiment, the tilt angle $\theta$ is adjusted so that a lower end 16Bd of the contact region 16B becomes shallower than a lower end 16Ad of the contact region 16A.

Then, a semiconductor device 6 shown in FIG. 19B is formed through the similar steps from FIG. 13A to FIG. 16A described above. The semiconductor device 6 may be provided with a drain electrode 50 and a source electrode 51.

The semiconductor device 6 includes the same configuration with the semiconductor device 1, and further includes the p-type contact region 16B connected to a contact region 13. The contact region 16B extends from the contact region 13 to the semiconductor layer 11 side. A distance between the lower end 16Bd of the contact region 16B and the back surface 11r of the semiconductor layer 11 is shorter than a distance between a lower end 14d of a source region 14 and the back surface 11r. Namely, the lower end 16Bd of the contact region 16B is located lower than the lower end 14d of the source region 14. The concentration of a p-type impurity contained in the contact region 16B is lower than the concentration of a p-type impurity contained in the contact region 13, and higher than or almost the same as the concentration of a p-type impurity contained in a base region 12.

In the semiconductor device 6, the distance between the lower end 16Bd of the contact region 16B and the back surface 11r of the semiconductor layer 11 is almost the same as a distance between the lower end of the base region 12 and the back surface 11r of the semiconductor layer 11. Namely, in the semiconductor device 6, the lower end 16Bd of the contact region 16B is located closely at the lower end of the base region 12.

According to the fourth embodiment, since the contact region 16B serving as a carrier extraction region is further provided in addition to the contact region 13, holes are easily discharged through the contact region 16B. Thus, in the semiconductor device 6, the avalanche breakdown voltage becomes higher as compared with the semiconductor device 1

It is noted that also in the fourth embodiment, the contact region 16B may be formed by introducing the p-type impurity element into the upper portion 11u of the semiconductor layer 11 after forming the contact region 13 or the base region 12 like the third embodiment.

Fifth Embodiment

Figure 20A:
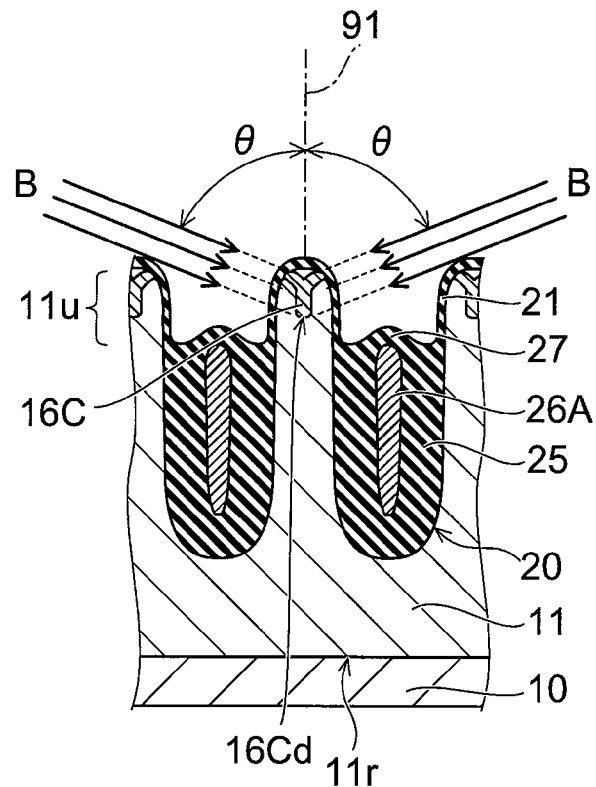
FIGS. 20A and 20B are schematic cross sectional views illustration a manufacturing process of a semiconductor device according to a fifth embodiment.
Figure 20B:
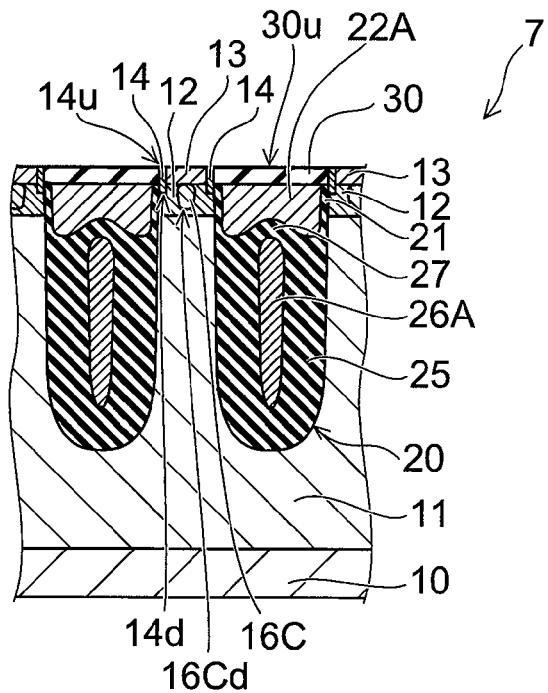

FIG. 20A and FIG. 20B are schematic cross sectional views illustrating the manufacturing process of a semiconductor device according to a fifth embodiment.

In the fifth embodiment, after forming a field plate electrode 26A, a p-type impurity element is introduced into an upper portion 11u of a semiconductor layer 11.

First, the step shown in FIG. 5A described above is carried out. Subsequently, a p-type impurity element such as boron B, for example, is implanted to the upper portion 11u of the semiconductor layer 11 not in parallel with a back surface normal 91 as shown in FIG. 20A. A tilt angle θ formed between the back surface normal 91 and the incident direction of boron is set in the range from 0 to 70°, for example. More specifically, the tilt angle θ is 70°. Namely, in the third to the fifth embodiment, oblique ion implantation is performed at the tilt angle θ ranging from 60° to 70°.

For example, boron is implanted from the right to the left and from the left to the right in the drawing in the upper portion 11u of the semiconductor layer 11 sandwiched between the adjacent trenches 20. In the boron implantation, the implant energy, dosed amount, incident angle, and the like are adjusted. The tilt angle θ in this case is set much smaller than in the fourth embodiment.

Thus, a p-type contact region 16C is formed in the upper portion 11u of the semiconductor layer 11, extending in the direction from the upper portion 11u of the semiconductor layer 11 to a semiconductor layer 10. In the fifth embodiment, the tilt angle θ is adjusted so that a lower end 16Cd of the contact region 16C becomes shallower than a lower end 16Bd of a contact region 16B.

Then, a semiconductor device 7 shown in FIG. 20B is formed through the similar steps from FIG. 13A to FIG. 16A described above. The semiconductor device 7 may be provided with a drain electrode 50 and a source electrode 51.

The semiconductor device 7 includes the same configuration with the semiconductor device 1, and further includes the p-type contact region 16C connected to a contact region 13. The contact region 16C extends from the contact region 13 to the semiconductor layer 11 side. A distance between the lower end 16Cd of the contact region 16C and the back surface 11r of the semiconductor layer 11 is shorter than a distance between the lower end 14d of the source region 14 and the back surface 11r. Namely, the lower end 16Cd of the contact region 16C is located lower than the lower end 14d of the source region 14. The concentration of a p-type impurity contained in the contact region 16C is lower than the concentration of a p-type impurity contained in the contact region 13, and higher than or almost the same as the concentration of a p-type impurity contained in the base region 12.

In the semiconductor device 7, the distance between the lower end 16Cd of the contact region 16C and the back surface 11r of the semiconductor layer 11 is longer than a distance between the lower end of the base region 12 and the back surface 11r. Namely, the lower end 16Cd of the contact region 16C is located above the lower end of the base region 12 in the semiconductor device 7.

According to the fifth embodiment, since the contact region 16C serving as a carrier extraction region is further provided in addition to the contact region 13, holes are easily discharged through the contact region 16C. Thus, the avalanche breakdown voltage in the semiconductor device 7 becomes higher as compared with the semiconductor device 1.

It is noted that also in the fifth embodiment, the contact region 16C may be formed by introducing the p-type impurity element into the upper portion 11u of the semiconductor layer 11 after forming the contact region 13 or the base region 12 like the third embodiment.

Sixth Embodiment

FIG. 21A to FIG. 22B are schematic cross sectional views illustrating the manufacturing process of a semiconductor device according to a sixth embodiment.

Figure 21A:
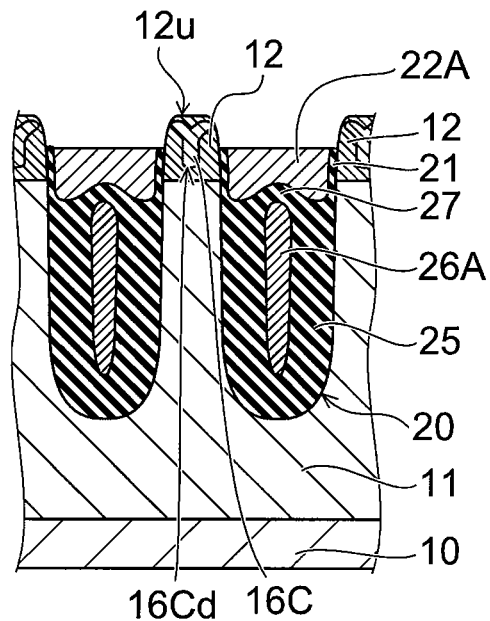
FIGS. 21A and 22B are schematic cross sectional views illustration a manufacturing process of a semiconductor device according to a sixth embodiment.

In the sixth embodiment, as shown in FIG. 21A, the step in FIG. 20A described above is carried out. Namely, a contact region 16C is formed in a base region 12. A contact region 13 is not formed in the sixth embodiment.

Figure 21B:
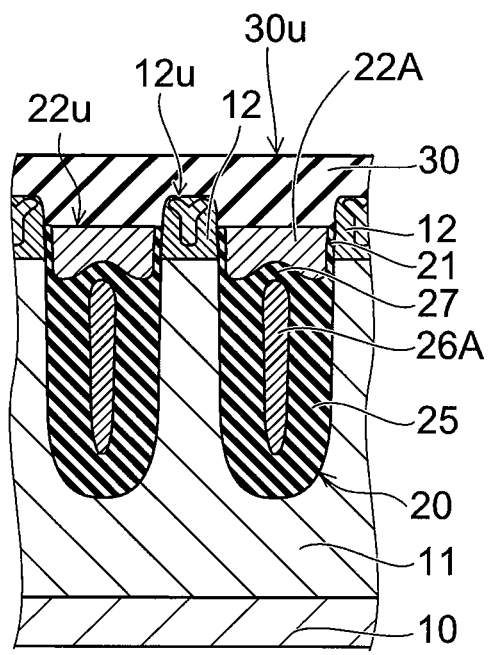

Subsequently, an upper face 22u of a gate electrode 22A and the base region 12 are covered with an interlayer insulating film 30 containing an n-type impurity element as shown in FIG. 21B.

Figure 22A:
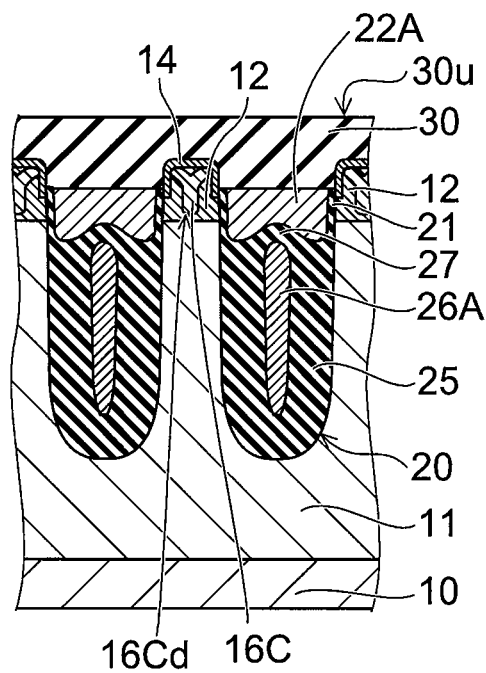

Subsequently, the n-type impurity element contained in the interlayer insulating film 30 is introduced into a surface 12u of the base region 12 as shown in FIG. 22A. For example, when the interlayer insulating film 30 is subjected to the heat treatment, the n-type impurity element contained in the interlayer insulating film 30 is introduced into the surface 12u of the base region 12 by thermal diffusion. The rapid thermal anneal (RTA) processing is used for the heat treatment. Thus, the surface 12u of the base region 12 is converted into an $n^+$-type source region 14.

Namely, the portion is converted to the $n^+$-type region, where phosphorus (P) is diffused from the interlayer insulating film 30, and the thin source region 14 is formed in the base region 12.

Figure 22B:
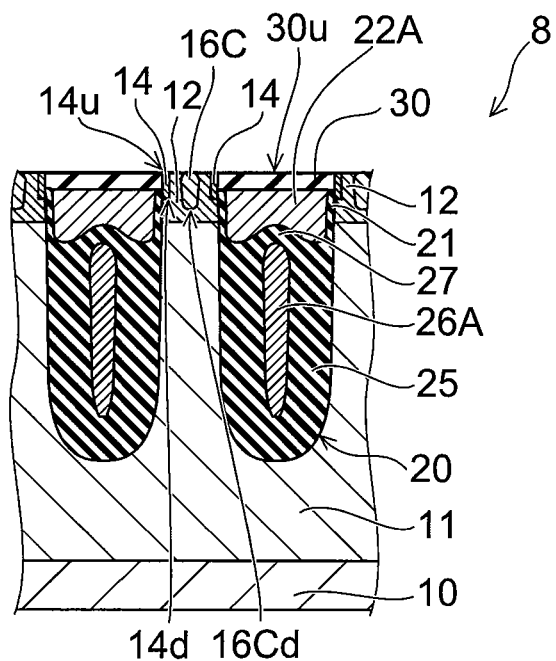

As shown in FIG. 22B, the interlayer insulating film 30 is etch-backed by wet etching, for example, and a part of the source region 14 is removed in such a way that the source region 14 remains on a part of the surface 12u of the base region 12. A part of the source region 14 is removed by dry etching, wet etching, CMP (Chemical Mechanical Polishing), or the like, for example. By removing the part of the source region 14, separating the source region 14 continuously formed on the surface of the base region 12 is separated into two portions. In this step, an upper face 30u of the interlayer insulating film 30 is formed to be flush with an upper end 14u of the source region 14.

A semiconductor device 8 is formed by such manufacturing process. In the semiconductor device 8, the contact region 16C is in contact with the base region 12 on the upper side of the base region 12. The source region 14 faces the side face of the contact region 16C. The semiconductor device 8 may be provided with a drain electrode 50 and a source electrode 51.

Although the semiconductor device 8 includes the configuration in which the contact region 13 is omitted from the configuration of the semiconductor device 1, the semiconductor device 8 includes the contact region 16C instead of the contact region 13. The contact region 16C extends from the surface of the base region 12 to the semiconductor layer 11 side. The distance between the lower end 16Cd of the contact region 16C and the back surface 11r of the semiconductor layer 11 is shorter than a distance between the lower end 14d of the source region 14 and the back surface 11r of the semiconductor layer 11. Namely, the lower end 16Cd of the contact region 16C is located lower than the lower end 14d of the source region 14. The concentration of a p-type impurity contained in the contact region 16C is higher than or almost the same as the concentration of a p-type impurity contained in the base region 12. For example, the dosed amount in forming the contact region 16C according to the sixth embodiment is $1 \times 10^{17}$ (atoms/cm$^3$).

According to the sixth embodiment, since the contact region 16C serving as a carrier extraction region is provided, holes are easily discharged through the contact region 16C. Thus, the semiconductor device 8 has a high avalanche breakdown voltage.

Hereinabove, certain embodiments are described with reference to specific examples. However, the embodiments are not limited to these specific examples. Namely, those whose design is appropriately modified and altered in these specific examples by a person skilled in the art are also included in the scope of the embodiments as long as they include the features of the embodiments. The components included in the foregoing specific examples and the disposition, materials, conditions, shape, size or the like of the components are not limited to those illustrated, which can be appropriately modified and altered.

Furthermore, the components included in the foregoing embodiments can be combined as long as technically feasible, and those combined are also included in the scope of the embodiments as long as they include the features of the embodiments. Additionally, a person skilled in the art conceives various modifications and alterations within the scope of the embodiments. All such modifications and alterations should be considered to belong to the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor layer of a first conductive type;
    a base region of a second conductive type provided on the semiconductor layer;
    a first contact region of a second conductive type provided on the base region;
    a gate electrode provided via a gate insulating film in a trench piercing through the first contact region and the base region and reaching the semiconductor layer;
    an interlayer insulating film provided on the gate electrode and containing a first conductive type impurity element;
    a source region of a first conductive type provided between the interlayer insulating film and the first contact region, the source region being in contact with a side face of the interlayer insulating film and extending in the base region;
    a first major electrode electrically connected to the semiconductor layer; and
    a second major electrode provided on the interlayer insulating film and connected to the source region and the first contact region.

2. The device according to claim 1,
    wherein a first conductive type impurity element contained in the source region is the same as the first impurity element contained in the interlayer insulating film.

3. The device according to claim 1,
    wherein a distance between an upper end of the source region and a back surface of the semiconductor layer is longer than a distance between an upper face of the gate electrode and the back surface of the semiconductor layer.

4. The device according to claim 1, further comprising:
    a field plate electrode provided below the gate electrode in the trench, the field plate electrode facing the semiconductor layer via a field insulating film.

5. The device according to claim 4, comprising:
    a plurality of the trenches piercing through the first contact region and the base region,
    wherein the base region is sandwiched between a pair of the adjacent trenches, and the base region is wider than a minimum width of the semiconductor layer between the pair of the adjacent trench.

6. The device according to claim 1,
    wherein a distance between a lower end of the source region and the back surface of the semiconductor layer is shorter than a distance between a lower end of the first contact region and the back surface of the semiconductor layer.

7. The device according to claim 1,
    wherein an upper face of the interlayer insulating film, an upper end of the source region, and an upper face of the first contact region are flush with each other.

8. The device according to claim 1,
    wherein a concentration of a second conductive type impurity contained in the first contact region is lower than a concentration of a first conductive type impurity contained in the source region.

9. The device according to claim 1,
    wherein the gate electrode is electrically connected to the second major electrode.

10. The device according to claim 1, further comprising:
    a second contact region of a second conductive type connected to the first contact region,
    wherein the second contact region extends from the first contact region to the semiconductor layer side, and
    a distance between a lower end of the second contact region and the back surface of the semiconductor layer is shorter than a distance between a lower end of the source region and the back surface of the semiconductor layer.

11. The device according to claim 10,
    wherein the distance between the lower end of the second contact region and the back surface of the semiconductor layer is shorter than a distance between a lower end of the base region and the back surface of the semiconductor layer.

12. The device according to claim 10, wherein the distance between the lower end of the second contact region and the back surface of the semiconductor layer is the same as the distance between the lower end of the base region and the back surface of the semiconductor layer.

13. The device according to claim 10, wherein the distance between the lower end of the second contact region and the back surface of the semiconductor layer is longer than the distance between the lower end of the base region and the back surface of the semiconductor layer.

14. The device according to claim 10, wherein a concentration of a second conductive type impurity contained in the second contact region is lower than a concentration of a second conductive type impurity contained in the first contact region and higher than a concentration of a second conductive type impurity contained in the base region.

* * * * *